United States Patent
Yasui

(10) Patent No.: US 6,425,095 B1
(45) Date of Patent: Jul. 23, 2002

(54) MEMORY TESTING APPARATUS

(75) Inventor: Takahiro Yasui, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/374,155

(22) Filed: Aug. 13, 1999

(30) Foreign Application Priority Data

Aug. 14, 1998 (JP) .......................................... 10-229732

(51) Int. Cl.$^7$ ................................................. H02H 3/05
(52) U.S. Cl. ........................ 714/42; 714/723; 365/201
(58) Field of Search .................... 714/42, 723, 718; 365/201

(56) References Cited

U.S. PATENT DOCUMENTS

| | | | | |
|---|---|---|---|---|
| 5,410,687 A | * | 4/1995 | Fujisaki et al. ............. | 365/201 |
| 5,568,437 A | * | 10/1996 | Jamal ..................... | 365/189.07 |
| 5,831,989 A | * | 11/1998 | Fujisaki ................... | 714/723 |
| 5,862,088 A | * | 1/1999 | Takemoto et al. ...... | 365/189.01 |

* cited by examiner

Primary Examiner—Robert Beausoleil
Assistant Examiner—Yolanda L. Wilson
(74) Attorney, Agent, or Firm—David N. Lathrop, Esq.; Gallagher & Lathrop

(57) ABSTRACT

There is provided a memory testing apparatus provided with a failure relief analyzer, which need not initialize, prior to counting the number of failure data, failure storing memories for storing therein counted values of the number of failure data. An output altering circuit is constituted by an initialization controller 7 for outputting an initialization signal on the basis of a row failure counter address signal outputted from an RFC address formatter 33 and a column failure counter address signal outputted from a CFC address formatter 43, and data controllers 34, 44 and 84 to each of which an initialization signal outputted from the initialization controller 7 is applied. By use of the output altering circuit, respective values of data read out from each address of a row failure storing memory, each address of a column failure storing memory and each address of a total failure storing memory are outputted as "0" only when they are read out at the first time.

5 Claims, 4 Drawing Sheets

○: RELIEF BLOCK WITH NO FAIL
×: RELIEF BLOCK WITH ONE OR MORE FAILS

MEMORY TESTING APPARATUS

BACKGROUND OF THE INVENTION

1. Field of the Invention

The present invention relates to a memory testing apparatus for testing various kinds of semiconductor memories including a memory being constructed by, for example, a semiconductor integrated circuit (hereinafter, referred to as IC), and more particularly, to an improvement in a memory testing apparatus provided with a failure relief analyzer for counting the number of failure memory cells of a tested semiconductor memory to determine whether the relief of the tested semiconductor memory can be carried out or not. (Hereinafter, a memory being constructed by a semiconductor integrated circuit is referred to as IC memory.)

2. Description of the Related Art

Recently, storage capacity of an IC memory is increasing more and more, and accordingly an increased IC chip area and formation of patterns at high density are required. As a result, there is an increased possibility that a reduction of the yield of IC memories caused by a very minute defect occurs. In order to prevent the yield of IC memories from being reduced, there are manufactured IC memories in each of which, for example, one or more failure memory cells can be electrically replaced by a substitute or alternative memory cell (also called a spare line, relief line or redundancy circuit). As will be described later, the IC memory of this kind is called a memory of redundancy structure in this technical field, and a decision as to whether the redundancy-structured memory can be relieved or not is rendered by a failure relief analyzer.

FIG. 2 shows a block diagram of a general construction of an example of the prior memory testing apparatus having a conventional failure relief analyzer. As is well known, this memory testing apparatus comprises a timing generator 10, a pattern generator 20, a waveform shaping device 30, a logical comparator 40, a failure analysis memory 50 and a failure relief analyzer 6. Further, in the following description, a case that the memory testing apparatus will test IC memories will be described. In case of testing various kinds of semiconductor memories other than IC memories by the memory testing apparatus, however, they will be tested in similar manner.

The timing generator 10 generates a clock CLK constituting a reference for the entire memory testing apparatus and various timing signals (not shown). Based on (in synchronism with) the reference clock CLK supplied from the timing generator 10, the pattern generator 20 generates address data ADRD, test pattern data PTND and control data CNTLD all of which are to be supplied to an IC memory under test (hereinafter, simply refereed to as memory under test) MUT. These data signals are inputted to the waveform shaping device 30 where they are converted, on the basis of timing signals (not shown) supplied from the timing generator 10, into an address signal ADR, a test pattern signal PTN and a control signal CNTL, respectively, having real waveforms required for testing the memory under test MUT. Thereafter, these signals are applied to the memory under test MUT.

The read/write operations of the memory under test MUT are controlled by the control signal CNTL supplied thereto through the waveform shaping device 30 so that a writing of the test pattern signal PTN applied from the waveform shaping device 30 in the memory under test and a reading of the written test pattern signal can be performed. The test pattern signal PTN written in the memory under test MUT is read out therefrom later, and the read-out response signal RPD is supplied to the logical comparator 40 where the response signal RPD is logically compared with an expected value pattern data (signal) EXP supplied from the pattern generator 20 to detect whether or not there is an anticoincidence between the two signals.

If the two signals do not coincide with each other, the logical comparator 40 determines that the memory cell having an address of the memory under test MUT from which the response signal RPD has been read out is defective (failure), and generates a failure signal FAIL indicating that fact. When the failure signal FAIL is generated from the logical comparator 40, usually, a logical "1" signal (data) is stored in a memory cell of the failure analysis memory 50 specified by address data ADRD (in practice, an address signal ADR obtained by converting this address data into a physical address) from the pattern generator 20. In general, this logical "1" signal is stored in the same address of the failure analysis memory 50 as that of the failure memory cell of the memory under test MUT.

On the contrary, if the response signal RPD coincides with the expected value pattern data EXP, the logical comparator 40 determines that the memory cell having an address of the memory under test MUT from which the response signal RPD has been read out is not defective (pass), and generates a pass signal indicating that fact. This pass signal is not stored in the failure analysis memory 50.

In such a way, the information on the failure memory cells (logical "1s") of the memory under test MUT generated during a series of tests is stored in the failure analysis memory 50. After the testing has been completed, the failure data stored in the failure analysis memory 50 are read out therefrom into the failure relief analyzer 6, thereby to carry out a failure analysis for the memory under test MUT.

The failure analysis memory 50 has its operating rate or speed and its memory capacity equivalent to those of the memory under test MUT, and the same address signal as the address signal ADR applied to the memory under test is also applied to this failure analysis memory 50. In addition, the failure analysis memory 50 is initialized prior to the start of a testing. For example, when initialized, the failure analysis memory 50 has data of logical "0s" written in all of the addresses thereof. Every time a failure signal FAIL indicating the anti-coincidence is generated from the logical comparator 40 during a testing of a memory under test MUT, a failure data of logical "1" indicating the failure of a memory cell is written in the same address of the failure analysis memory 50 as that of the memory cell of the memory under test MUT from which that anti-coincidence has been generated.

The failure relief analyzer 6 separately and simultaneously counts the total number of failure memory cells stored in the failure analysis memory 50, and the number of failure memory cells on each address line of row (lateral) address lines and column (longitudinal) address lines stored in the failure analysis memory 50, and analyzes to determine whether the relief of the tested memory can be done or not by use of relief lines, i.e., spare memory cells (spare lines or redundancy circuits) provided in the memory under test MUT. A memory having such relief lines provided therein is, as mentioned above, called a redundancy-structured memory in this technical field.

Here, a brief explanation will be given regarding a redundancy-structured memory. FIG. 3 shows in outline an arrangement of an example of such redundancy-structured memories. A memory under test MUT is provided with, in addition to a memory cell array (main storage portion) MCA where memory cells are arrayed in rows and in columns, row address relief lines SR and column address relief lines SC formed on the periphery of the memory cell array MCA. The memory cell array MCA, the row address relief lines SR and the column address relief lines SC are formed in the same semiconductor chip. In this example, a case is shown where two row address relief lines SR are disposed along one side of the row address direction of the memory cell array MCA and two column address relief lines SC are disposed along one side of the column address direction of the memory cell array MCA, respectively. However, it is needless to say that the number of relief lines and the positions where these relief lines are disposed are not limited to the example as illustrated.

As a result of the testing of the memory under test MUT, in case that three failure memory cells X1, X2 and X3 are detected, for example, on the i-th row address line Ri (i is an integer) and three failure memory cells Y1, Y2 and Y3 are detected, for example, on the i-th column address line Ci (i is an integer), if the row address line Ri is substituted by any one of the row address relief lines SR with respect to its electrical connection, the row address line Ri having the failure memory cells can be relieved. Similarly, if the column address line Ci is substituted by any one of the column address relief lines SC with respect to its electrical connection, the column address line Ci having the failure memory cells can also be relieved.

In such a way, the redundancy-structured memory is arranged such that failure memory cells in its memory cell array MCA can be relieved by its row and column address relief lines. Therefore, by counting the number of failure memory cells of each row address line and the number of failure memory cells of each column address line and by comparing the number of row and column address lines each having failure cells with the number of relief lines, a decision can be rendered as to whether the memory cell array MCA can be relieved or not.

For this reason, as shown in FIG. 4, in the conventional failure relief analyzer 6 the number of failure memory cells in each row address line within the memory cell array MCA is counted by a row address failure counter (RFC) 3 and the number of failure memory cells in each column address line within the memory cell array MCA is counted by a column address failure counter (CFC) 4, and in addition, the total number of failure memory cells are counted by a total failure counter (TFC) 81. Then, based upon these counted values, the possibility of relief of the memory cell array MCA is determined.

Further, the row address failure counter 3 and the column address failure counter 4 are, in practice, constructed such that they count the number of failure data representing failure memory cells on each of the row address lines and the number of failure data representing failure memory cells on each of the column address lines read out from the failure analysis memory 50, respectively, and store the counted values in their failure storing memories. The total failure counter 81 is constructed such that it accumulates, every time a failure data is read out from the failure analysis memory 50, the number of occurrences of the failure data, and stores the accumulated value in a total failure storing memory of the total failure counter 81.

An actual analysis in the failure relief analyzer 6 as to whether the memory under test MUT can be relieved or not is carried out by dividing, as shown in FIG. 5, the memory cell array MCA into several ten to several thousand relief blocks B, and for each of the divided relief blocks B. Therefore, the counting operations of the number of failure memory cells (the number of failure data) in the total failure counter 81, the row address failure counter 3 and the column address failure counter 4 are performed for each of the divided relief blocks, respectively. In this case, the counting operation of the number of failure data is carried out such that the stored content of the failure storing memory of each counter is read out therefrom, and the read-out value is incremented by one, which is stored back in each failure storing memory if the read-out data from the failure analysis memory 50 is "1" (if a failure data is read out), or the read-out value is maintained as it is, and is stored back in each failure storing memory if a failure data is not read out from the failure analysis memory 50. Therefore, each of the failure storing memories for storing therein the counted value of the number of failure data must be initialized without fail prior to performing the counting operation of the number of failure data for each relief block B.

In FIG. 5, relief blocks to which o is affixed show relief blocks in which any failure memory cell has not been detected, and relief blocks to which x is affixed show relief blocks in which one or more failure memory cells have been detected. In addition, since the failure relief analysis for a memory under test is performed for each relief block basis, a block address for specifying each relief block is necessary. In FIG. 5, reference characters #0, #1, #2, . . . , #1F affixed to the respective relief blocks show block addresses, respectively. The number of failure memory cells counted for each of the relief blocks is stored in a memory cell of a block failure memory BFM having the same address as the corresponding block address.

In recent years, a memory under test is increasing more and more in its memory capacity, and the number of relief blocks and the size tend to be increased. Associated with this fact, the capacity of each of the failure storing memories for storing therein the counted value of the number of failure memory cells is also increased. For this reason, there has been a problem that it takes a long time to initialize these failure storing memories, and hence a time duration required for the failure relief analysis of a memory under test becomes long. Accordingly, it has been requested that a time duration needed to initialize the data stored in these failure storing memories is reduced, and the failure relief analysis can be carried out at high speed.

SUMMARY OF THE INVENTION

It is an object of the present invention to provide a memory testing apparatus provided with a failure relief analyzer, which is capable of carrying out a failure relief analysis for a redundancy-structured memory at high speed.

It is another object of the present invention to provide a memory testing apparatus provided with a failure relief analyzer, which need not initialize, prior to counting the number of failure data representing failure memory cells of a memory under test, failure storing memories for storing therein counted values of the number of failure data.

In order to accomplish the aforesaid objects, in one aspect of the present invention, there is provided a memory testing apparatus which comprises: a failure analysis memory for storing therein failure data representing a failure memory cell of a memory under test; and failure relief analyzer for carrying out a failure relief analysis for a tested memory on the basis of failure data stored in the failure analysis memory, the failure relief analyzer comprising: a failure storing memory for storing therein the number of failure data read out from the failure analysis memory; and an output altering circuit for outputting the value of read-out data read out at the first time from each address of the failure storing memory as "0".

The output altering circuit is constituted by an initialization controller for generating an initialization signal when data is read out at the first time from each address of the failure storing memory; and a data controller for outputting an output of the failure storing memory as it is in the case that the initialization signal does not come to the data controller from the initialization controller and outputting "0" in the case that the initialization signal comes to the data controller from the initialization controller.

In one preferred embodiment, the aforesaid failure storing memory for storing the number of failure data read out from the failure analysis memory is a row failure storing memory provided in a row address failure counter for counting the number of failure data for each row address line of the failure analysis memory, a column failure storing memory provided in a column address failure counter for counting the number of failure data for each column address line of the failure analysis memory and a total failure storing memory provided in a total failure counter for counting the total number of failure data.

In addition, the aforesaid output altering circuit is constituted by an initialization controller for applying an initialization signal to the row address failure counter when a row counter address signal for accessing the row failure storing memory is "0", applying an initialization signal to the column address failure counter when a column counter address signal for accessing the column failure storing memory is "0" and applying an initialization signal to the total failure counter when both of the row counter address signal and the column counter address signal are "0"; and data controllers provided respectively in the failure counters, each data controller outputting an output read out from the associated failure storing memory as it is in the case that the initialization signal is not applied thereto from the initialization controller and outputting "0" in the case that the initialization signal is applied thereto from the initialization controller.

The aforesaid failure relief analyzer further comprises: a TFC address formatter for formatting a total failure counter address signal for accessing the total failure storing memory of the total failure counter on the basis of row address data and column address data inputted thereto, and outputting the formatted address signal; an RFC address formatter for formatting a row failure counter address signal for accessing the row failure storing memory of the row address failure counter on the basis of row address data and the total failure counter address signal inputted thereto, and outputting the formatted address signal; a CFC address formatter for formatting a column failure counter address signal for accessing the column failure storing memory of the column address failure counter on the basis of column address data and the total failure counter address signal inputted thereto, and outputting the formatted address signal. The initialization controller produces the initialization signal on the basis of the row failure counter address signal supplied from the RFC address formatter and the column failure counter address signal supplied from the CFC address formatter, and the row address failure counter, the column address failure counter and the total failure counter include respective adders each adding an output of corresponding one of the failure analysis memories to an output of corresponding one of the data controllers and supplying the result of addition to corresponding one of the row failure storing memory, the column failure storing memory and the total failure storing memory.

DETAILED DESCRIPTION OF THE PREFERRED EMBODIMENTS

Figure 1:
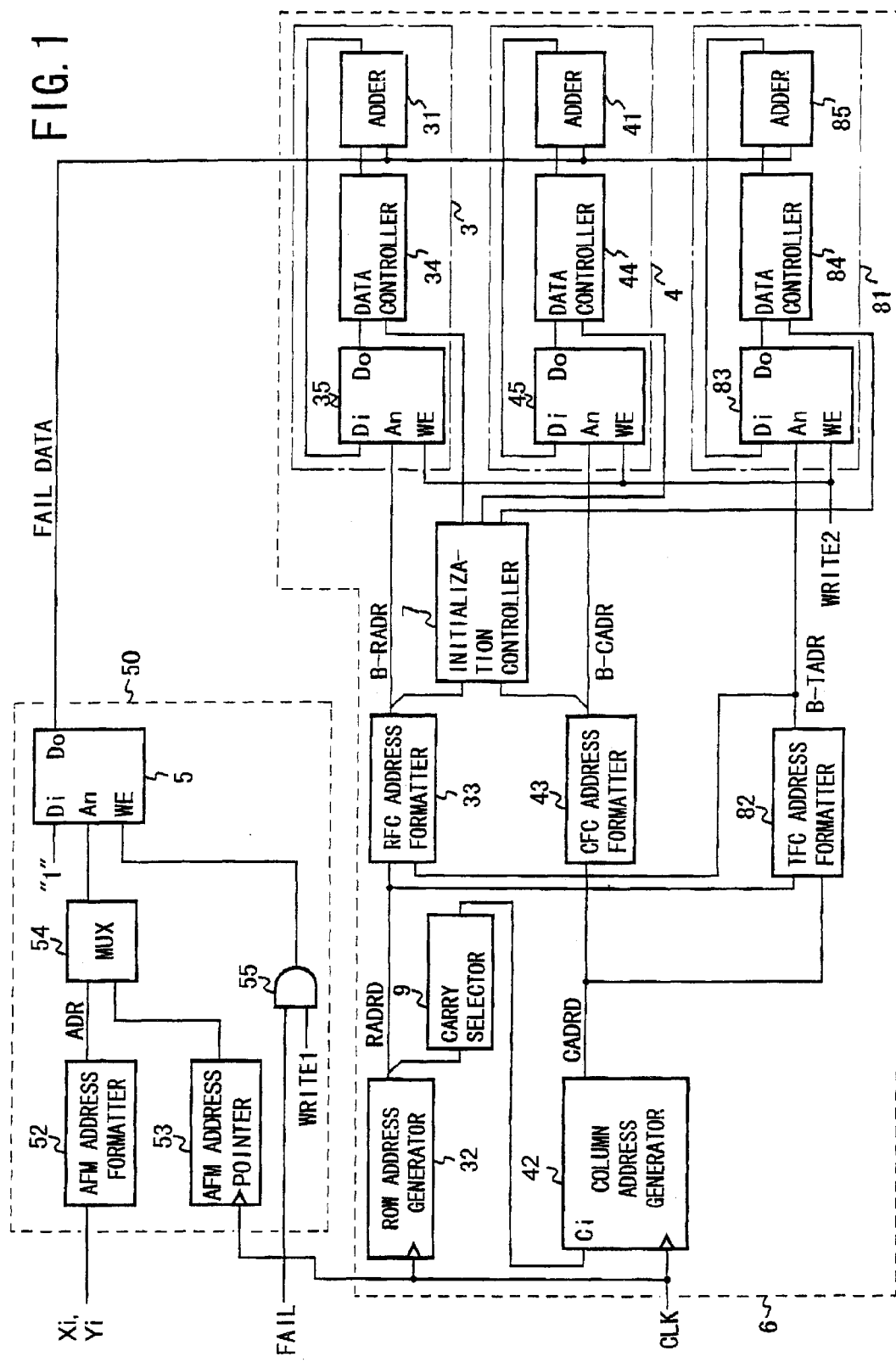
FIG. 1 is a block diagram showing configurations of a failure analysis memory and a failure relief analyzer respectively used in an embodiment of the memory testing apparatus according to the present invention.

Now, the present invention will be described with regard to a preferred embodiment of the memory testing apparatus according to the present invention in detail with reference to FIG. 1 showing the constructions of a failure analysis memory and a failure relief analyzer that are essential elements of the memory testing apparatus.

Figure 2:
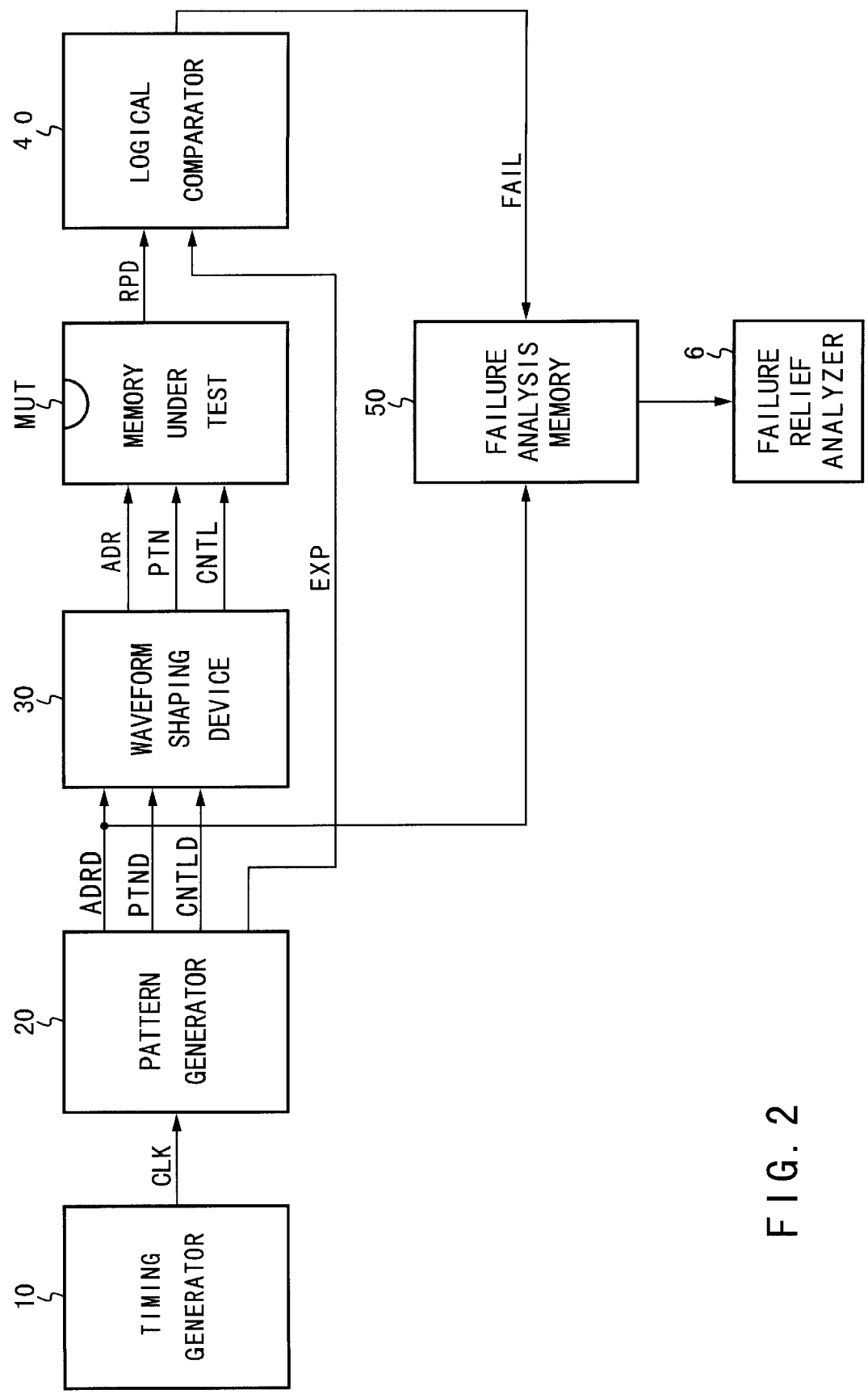
FIG. 2 is a block diagram showing an example of the conventional memory testing apparatus.
Figure 3:
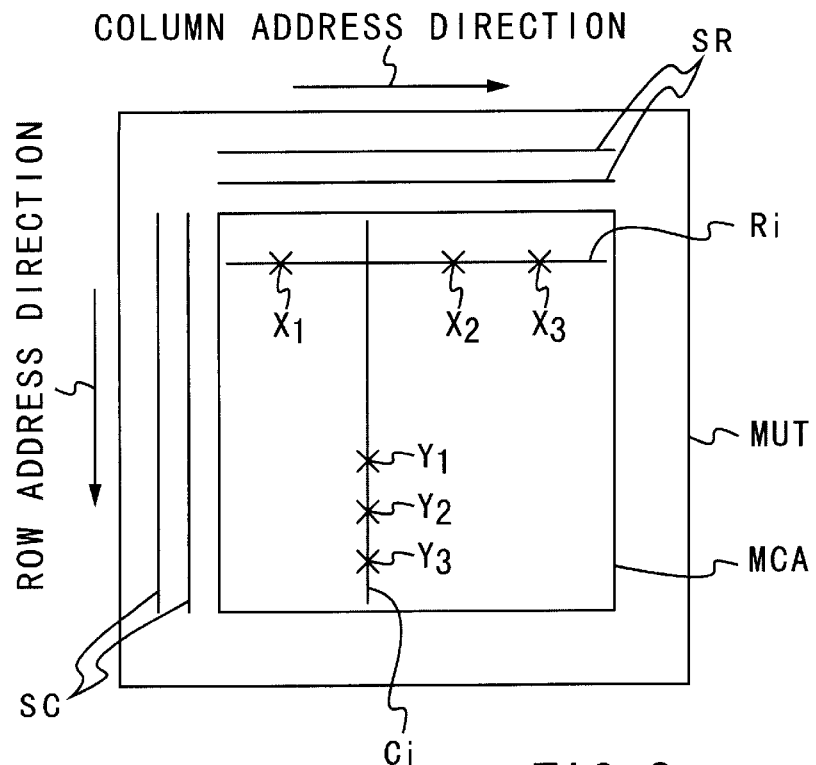
FIG. 3 is an illustration for explaining a redundancy-structured memory.
Figure 4:
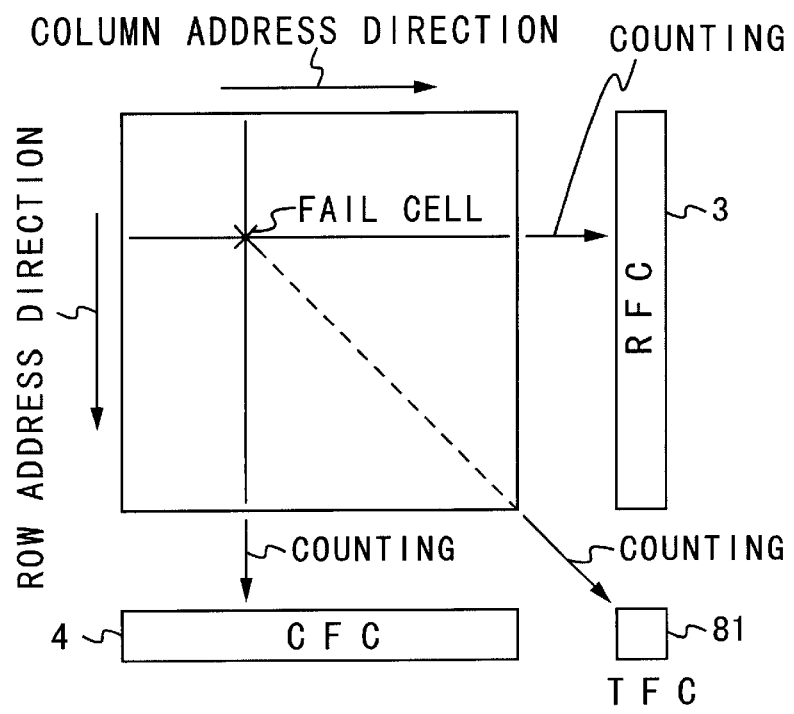
FIG. 4 is an illustration for explaining a counting operation of failure memory cells in the failure relief analyzer shown in FIG. 2.
Figure 5:
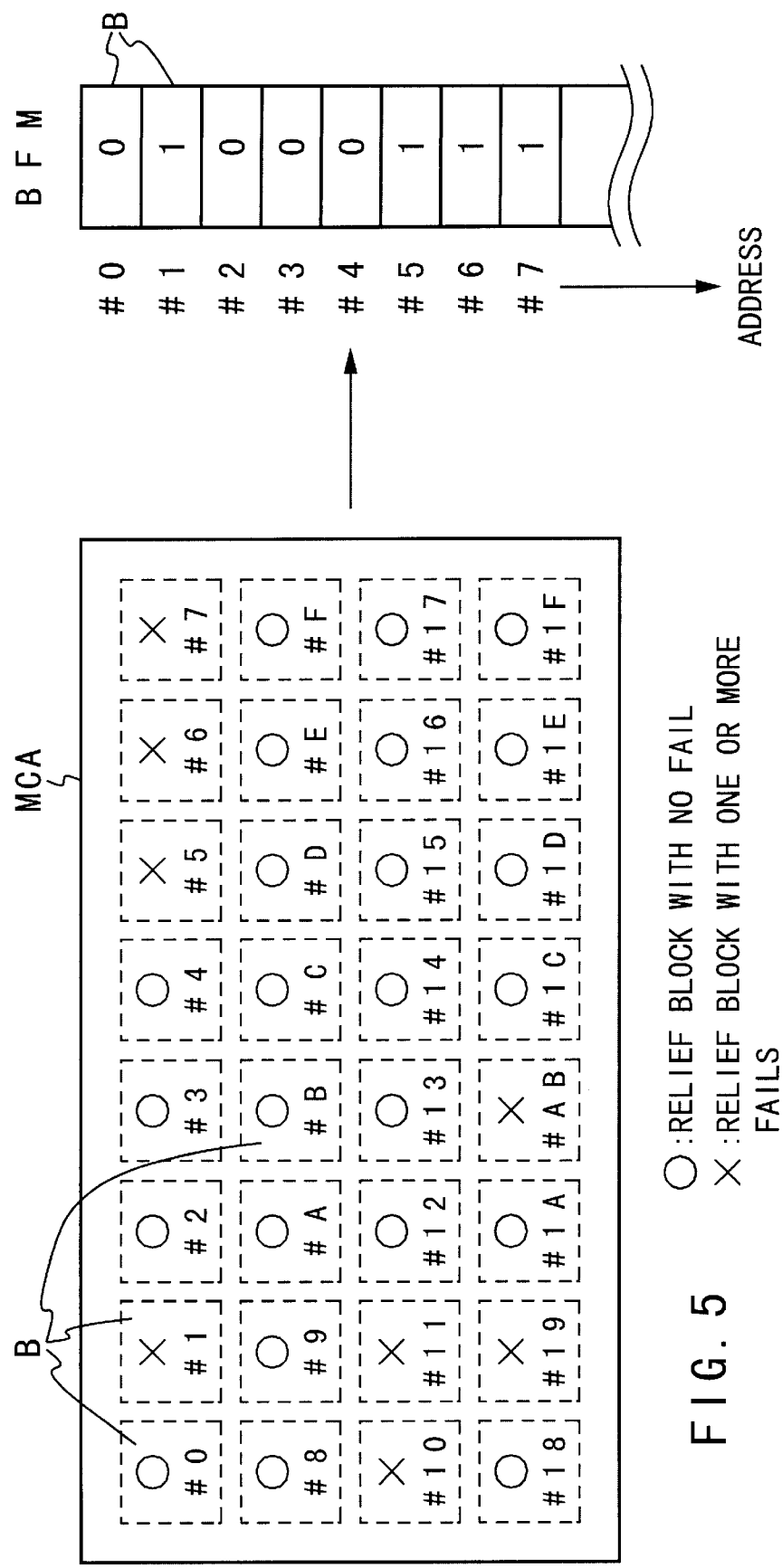
FIG. 5 is a diagram for explaining an actual analyzing method in the failure relief analyzer shown in FIG. 2.

The failure analysis memory 50 comprises an AFM address formatter 52 for converting an address data (logical address) ADRD supplied from the pattern generator 20 shown in FIG. 2 into a physical address signal ADR, an address failure memory (AFM) 5 for storing therein a failure data indicating a failure memory cell of a memory under test MUT, an AFM address pointer 53 for outputting address signals by which all addresses of the address failure memory 5 can be specified, a multiplexer 54 for switching between an address signal outputted from the AFM address pointer 53 and an address signal ADR outputted from the AFM address formatter 52 to supply one of these address signals to the address failure memory 5, and an AND gate 55 for controlling the write operation of failure data into the address failure memory 5.

The AFM address formatter 52 formats, from row address data Xi (i is an integer) and column address data Yi (i is an integer) supplied from the pattern generator 20, an address signal ADR for accessing the address failure memory 5 (an address signal that is the same as an address signal ADR outputted from the waveform shaping device 30 shown in FIG. 2) to supply the address signal ADR to the multiplexer 54. The multiplexer 54 applies the address signal ADR supplied from the AFM address formatter 52 to an address input terminal An of the address failure memory 5 during the testing of a memory under test MUT, and applies the address signal supplied from the AFM address pointer 53 to the address input terminal An of the address failure memory 5 during that the failure relief analysis of a tested memory is carried out.

A failure signal FAIL is applied to one input terminal of the AND gate 55 from the logical comparator 40 shown in FIG. 2, and to the other input terminal thereof is applied a write timing signal WRITE1. When the failure signal FAIL is applied as well as the write timing signal WRITE1 is applied, the AND gate 55 outputs a write enable signal to a write enable terminal WE of the address failure memory 5 at the timing of application of the write timing signal, thereby to enable the write operation of a failure data "1" that is always applied to a data input terminal Di of the address failure memory 5. As a result, the failure data "1" is written in an address of the address failure memory 5 specified by the address signal ADR from the address formatter 52. Accordingly, the failure data "1" representing an occurrence of a failure memory cell is written in the same address of the address failure memory 5 as that of the failure memory cell of the memory under test MUT.

In this manner, the address failure memory 5 is accessed, each time a failure signal FAIL is outputted from the logical comparator 40, by the same address signal as the address signal ADR being applied to the memory under test MUT at that time. Therefore, a failure data of logical "1" is written in the same address of the address failure memory 5 as that of the failure memory cell of the memory under test MUT. Consequently, at the time of completion of the testing, all of the addresses of the failure memory cells of the memory under test MUT are written in the address failure memory 5 as failure data of logical "1s".

The failure relief analyzer 6 includes a row address generator 32 for generating row addresses to be used in this failure relief analyzer 6, a column address generator 42 for generating column addresses to be used in the failure relief analyzer 6, a carry selector (carry detector) 9 for detecting when the row address generator 32 has generated the address data of all of the rows and outputting a carry signal, a row address failure counter (RFC) 3 for counting the number of failure memory cells for each of the row address lines of a memory under test, a column address failure counter (CFC) 4 for counting the number of failure memory cells for each of the column address lines of the memory under test, a total failure counter (TFC) 81 for counting the total number of failure memory cells, an RFC address formatter 33 for producing a row failure counter address signal B-RADR for accessing the row address failure counter 3, a CFC address formatter 43 for producing a column failure counter address signal B-CADR for accessing the column address failure counter 4, and an TFC address formatter 82 for producing a total failure counter address signal B-TADR for accessing the total failure counter 81.

The row address failure counter 3 is constituted by a row failure storing memory 35 for storing therein the number of failure memory cells for each of the rows, a data controller 34 and an adder 31, the latter two elements will be described later. The column address failure counter 4 is constituted by a column failure storing memory 45 for storing therein the number of failure memory cells for each of the columns, a data controller 44 and an adder 41, the latter two elements will be described later. The total failure counter 81 is constituted by a total failure storing memory 83 for storing therein the total number of failure memory cells, a data controller 84 and an adder 85, the latter two elements will be described later.

Further, the row address generator 32, the column address generator 42 and the AFM address pointer 53 operate in synchronism with one another by the reference clock CLK.

The carry selector 9 outputs a carry signal whenever a predetermined number of bits constituting the row address data RADRD outputted from the row address generator 32 become all "1s" (whenever a row address data of the last row is outputted), and this carry signal is supplied to a carry signal input terminal Ci of the column address generator 42. The column address generator 42 increments, each time it receives the carry signal, the column address by one, and outputs the column address data CADRD corresponding to the result of this incrementing operation.

The TFC address formatter 82 formats and outputs the total failure counter address signal B-TADR for accessing the total failure storing memory 83 of the total failure counter 81 on the basis of the row address data RADRD outputted from the row address generator 32 and the column address data CADRD outputted from the column address generator 42. The total failure counter address signal B-TADR is an address signal that specifies one specific relief block among several ten to several thousand relief blocks obtained by dividing the memory cell array MCA of the memory under test MUT into minute areas. The total counter address signal B-TADR is supplied to an address input terminal An of the total failure storing memory 83 to specify the specific one relief bock. In addition, the total counter address signal is also supplied to the RFC address formatter 33 and the CFC address formatter 43.

The RFC address formatter 33 formats and outputs a row failure counter address signal B-RADR on the basis of the row address data RADRD outputted from the row address generator 32 and the total counter address signal B-TADR outputted from the TFC address formatter 82, and the row failure counter address signal B-RADR is applied to an address input terminal An of the row failure storing memory 35 of the row address failure counter 3. The row counter address signal B-RADR is an address signal for specifying one row in a specified relief block, and is constituted by a relief block address signal (the total counter address signal B-TADR) and a row address signal (the row counter address signal B-RADR) of the specified relief block.

The CFC address formatter 43 formats and outputs a column failure counter address signal B-CADR on the basis of the column address data CADRD outputted from the column address generator 42 and the total counter address signal B-TADR outputted from the TFC address formatter 82, and the column failure counter address signal B-CADR is applied to an address input terminal An of the column failure storing memory 45 of the column address failure counter 4. The column counter address signal B-CADR is an address signal for specifying one column in a specified relief block, and is constituted by a relief block address signal (the total counter address signal B-TADR) and a column address signal (the column counter address signal B-CADR) of the specified relief block.

In the present invention, it is characterized that there is provided in the failure relief analyzer 6 an output altering circuit by which values of respective data read out from the row failure storing memory, the column failure storing memory and the total failure storing memory are outputted as "0" only when the data have been read out at the first time. In the illustrated embodiment, this output altering circuit comprises an initialization controller 7 having the row counter address signal B-RADR outputted from the RFC address formatter 33 and the column counter address signal B-CADR outputted from the CFC address formatter 43 inputted thereto, and outputting an initialization signal based on these address signals, the data controller 34 of the row address failure counter 3, the data controller 44 of the column address failure counter 4 and the data controller 84 of the total failure counter 81, each of these data controllers 34, 44 and 84 being applied with the initialization signal outputted from the initialization controller 7.

This initialization controller 7 is constructed in this embodiment such that it outputs an initialization signal to the data controller 34 of the row address failure counter 3 when the column counter address signal B-CADR outputted from the CFC address formatter 43 excluding the total counter address signal B-TADR which specifies a relief block is "0", that is, when a predetermined number of bits constituting the column counter address signal for the specified relief block is all zeros (which corresponds to the first column counter address signal), outputs an initialization signal to the data controller 44 of the column address failure counter 4 when the row counter address signal B-RADR outputted from the RFC address formatter 43 excluding the total counter address signal B-TADR which specifies a relief block is "0", that is, when a predetermined number of bits constituting the row counter address signal for the specified relief block is all zeros (which corresponds to the first row counter address signal), and further, outputs an initialization signal to the data controller 84 of the total failure counter 81 when both of the initialization conditions for the data controller 34 and the data controller 44 are satisfied, that is, when the column counter address signal B-CADR excluding the total counter address signal B-TADR is zero and also the row counter address signal B-RADR excluding the total counter address signal B-TADR is zero.

On the other hand, the data controller 34 of the row address failure counter 3 is constructed such that it outputs an output of the row failure storing memory 35 itself to the adder 31 when an initialization signal is not received from the initialization controller 7, and outputs "0" to the adder 31 when an initialization signal is received from the initialization controller 7. Similarly, the data controller 44 of the column address failure counter 4 is constructed such that it outputs an output of the column failure storing memory 45 itself to the adder 41 when an initialization signal is not received from the initialization controller 7, and outputs "0" to the adder 41 when an initialization signal is received from the initialization controller 7. Moreover, the data controller 84 of the total failure counter 81 is constructed such that it outputs an output of the total failure storing memory 83 itself to the adder 85 when an initialization signal is not received from the initialization controller 7, and outputs "0" to the adder 85 when an initialization signal is received.

The adder 31 of the row address failure counter 3 adds, when a failure data ("1") is read out from the address failure memory 5 of the failure analysis memory 50, "+1" to the output value of the data controller 34, and supplies the added value to a data input terminal Di of the row failure storing memory 35. When any failure data is not read out from the address failure memory 5, the adder 31 directly supplies the output value of the data controller 34 itself to the data input terminal Di of the row failure storing memory 35. Similarly, the adder 41 of the column address failure counter 4 adds, when a failure data is read out from the address failure memory 5 of the failure analysis memory 50, "+1" to the output value of the data controller 44, and supplies the added value to a data input terminal Di of the column failure storing memory 45. When any failure data is not read out from the address failure memory 5, the adder 41 directly supplies the output value of the data controller 44 itself to the data input terminal Di of the column failure storing memory 45. The adder 85 of the total failure counter 81 adds, when a failure data is read out from the address failure memory 5 of the failure analysis memory 50, "+1" to the output value of the data controller 84, and supplies the added value to a data input terminal Di of the total failure storing memory 83. When any failure data is not read out from the address failure memory 5, the adder 85 directly supplies the output value of the data controller 84 itself to the data input terminal Di of the total failure storing memory 83.

The output signals of the adders 31, 41 and 85 supplied to the data input terminals Di of those memories 35, 45 and 83, respectively, are stored, when a write timing signal WRITE2 is applied to each of write enable terminals WE of the memories 35, 45 and 83, in the specified addresses of relief blocks specified by address signals applied to the address signal input terminals An, respectively.

Next, the failure relief analyzing operation in the memory testing apparatus having the failure analysis memory 50 and the failure relief analyzer 6 constructed as mentioned above will be described.

First, in the testing of the memory under test MUT already discussed, the failure data "1s" indicating all the failure memory cells of the memory under test MUT have been stored in the memory cells of the address failure memory 5 of the failure analysis memory 50 at the same addresses thereof as those of the failure memory cells of the memory under test MUT, respectively. The row address generator 32 and the column address generator 42 are initialized prior to reading out the failure data from the address failure memory 5.

When the failure relief analyzing operation is started, the row address generator 32 and the column address generator 42 already initialized generate the first row address data all bits of which are zeros and the first column address data all bits of which are zeros. The initialization controller 7 has a row counter address signal B-RADR including a row address signal all bits of which are zeros and a column counter address signal B-CADR including a column address signal all bits of which are zeros inputted thereto from the RFC address formatter 33 and the CFC address formatter 43 respectively, and hence supplies an initialization signal to each of the data controllers 34, 44 and 84 of the respective counters. As a result, these data controllers 34, 44 and 84 outputs "0", and the adders 31, 41 and 85 supply the "0" to the data input terminals Di of the respective memories 35, 45 and 83, respectively. The "0" supplied to each of the data input terminals Di is stored in the addresses of these memories specified by the address signals, when a write enable signal is applied to the associated memory. Therefore, these addresses into which "0" has been written are initialized.

At the same time, the first address signal is generated from the AFM address pointer 53 of the failure analysis memory 50 which operates in synchronism with the row address generator 32 and the column address generator 42. Consequently, the address failure memory 5 is accessed by the first address signal through the multiplexer 54, which results in the start of reading out failure data stored therein. An output signal read out from the address failure memory 5 is supplied to one input terminal of each oft he adders 31, 41 and 85 of the respective counters 3, 4 and 81.

Thereafter, the row address generator 32 and the AFM address pointer 53 increment the respective addresses by one, thereby to sequentially output corresponding address data and address signal, respectively.

When a failure data "1" is read out from the address failure memory 5, the adders 31, 41 and 85 add "+1" to the data (which is "0" by initialization) read out from the data controllers 34, 44 and 84, and supply the added values to the data input terminals Di of the memories 35, 45 and 83, respectively. Accordingly, the number of row failures, the number of column failures and the number of total failures can be counted to store them in the associated memories 35, 45 and 83, respectively.

Specifically explaining, every time that a row counter address signal and a column counter address signal are inputted to the address input terminals An of the memories 35 and 45 respectively so that a row address and a column address of the specified relief blocks of these memories 35 and 45 are specified, the counted values of failure data stored in the specified row address and the column address are read out from these memories, respectively, and are supplied to the corresponding data controllers 34 and 44. Since the data controllers 34 and 44 directly supply the read-out counted values itself to the corresponding adders 31 and 41 respectively unless an initialization signal is applied thereto from the initialization controller 7, the adders 31 and 41 add "+1" to the values read out from the memories 35 and 45 every time a failure data "1" is read out from the address failure memory 5, and supply the added values to the data input terminals Di of the memories 35 and 45, respectively.

The total failure counter 81 stores in the relief block of the memory 83 specified by the total counter address signal the added value (the counted value of failure data) which is incremented by one ever time a failure data is read out from the address failure memory 5.

When the address of the row address generator 32 is incremented by one in the sequential order so that all of the predetermined number of bits constituting the row address data RADR become "1s", that is, when the address data of the last row is outputted, a carry signal is outputted from the carry selector 9, which is inputted to a carry terminal Ci of the column address generator 42. By the application of the carry signal, the column address generator 42 increments the column address by one. In other words, the column address generator 42 continues to output the same column address data unless a carry signal is outputted from the carry selector 9. On the contrary, the row address generator 32 returns to the address of the first row after it has outputted the address data of the last row, and then outputs the address data which is sequentially incremented by one from the address of the first row. Accordingly, at the time of starting the analysis operation, the column address generator 42 continues to output the first column address data all bits of which are "0s" during that the row address data RADR generated from the row address generator 32 is being incremented from the first row address all bits of which are zeros to the last row address all bits of which are "1s", and so the row failure storing memory 35 of the row address failure counter 3 are initialized in all of the rows of the specified relief block thereof. On the other hand, the column failure storing memory 45 of the column address failure counter 4 is sequentially initialized in its columns because an initialization signal is applied to the data controller 44 of the column address failure counter 4 from the initialization controller 7 every time the address generated from the row address generator 32 returns to the first row address (all bits of which are "0s").

The above counting operation of the failure memory cells continues until all of the addresses of the failure memory 5 are accessed. Thus, the number of row failures, the number of column failures and the number of total failures can be stored in the associated memories 35, 45 and 83, respectively.

During the counting operation of the failure memory cells, as already described, the data controller 34 of the row address failure counter 3 supplies "0" to the adder 31 when an initializing signal is supplied thereto from the initialization controller 7, and directly supplies the data itself read out from the row failure storing memory 35 to the adder 31 when the initialization controller 7 does not output an initializing signal. Consequently, in the case that the data controller 34 outputs "0", the adder 31 writes in the row failure storing memory 35 the added value "1" obtained by adding "+1" to this "0" when a failure data is read out from the address failure memory 5. In the case that a failure data is not read out from the address failure memory 5, the adder 31 directly writes the inputted "0" itself in the row failure storing memory 35. In this manner, in the case that the initialization controller 7 outputs an initializing signal, "0" is supplied to the adder 31 regardless of the value of data read out from the row failure storing memory 35, and hence the row failure storing memory 35 is initialized each time the analysis operation for the next relief block is started.

Similarly, as to the column failure storing memory 45 and the total failure storing memory 83, they are initialized each time the analysis operation for the next relief block is started, which results in generation of an initializing signal from the initialization controller 7.

Further, in the aforementioned embodiment, the memory testing apparatus is constructed such that the output altering circuit is constituted by the initialization controller 7, the data controllers 34, 44 and 84, and that when the initialization controller 7 outputs an initialization signal, the values of the read-out data from the row failure storing memory 35, the column failure storing memory 45 and the total failure storing memory 83 are regarded as "0". However, the construction of the output altering circuit is not limited to the construction of the illustrated embodiment. For example, it is needless to say that in the case that all bits of the first row address data and all bits of the first column address data are not zeros, the memory testing apparatus is constructed such that the initialization controller 7 generates an initialization signal when the first row address data and the first column address data are generated. In short, the output altering circuit may be constructed such that it outputs, for each relief block, the value of read-out data read out at the first time from each address of the row failure storing memory 35, the column failure storing memory 45 and the total failure storing memory 83 as "0".

As is apparent from the foregoing description, according to the present invention, it is not necessary to initialize the row failure storing memory, the column failure storing memory and the total failure storing memory for storing counted values of failure memory cells of a memory under test respectively, prior to performing the counting operation of the number of failure memory cells for each of the relief blocks. Accordingly, no time is required for initializing these failure storing memories. As a result, there can be obtained a remarkable advantage that a time duration needed for the failure relief analysis of the memory under test can be reduced, and hence the failure relief analysis can be performed at high speed or quickly.

While the present invention has been described with regard to the preferred embodiment shown by way of example, it will be apparent to those skilled in the art that various modifications, alterations, changes, and/or minor improvements of the embodiment described above can be made without departing from the spirit and the scope of the present invention. Accordingly, it should be understood that the present invention is not limited to the illustrated embodiment, and is intended to encompass all such modifications, alterations, changes, and/or minor improvements falling within the scope of the invention defined by the appended claims.

What is claimed is:

1. A memory testing apparatus comprising: a failure analysis memory for storing therein failure data representing a failure memory cell of a memory under test; and failure relief analyzer for carrying out a failure relief analysis for a tested memory on the basis of failure data stored in said failure analysis memory, said failure relief analyzer comprising: a failure storing memory for storing therein the number of failure data read out from said failure analysis memory; and an output altering circuit for outputting the value of read-out data read out at the first time from each address of said failure storing memory as "0".

2. The memory testing apparatus as set forth in claim 1, wherein said output altering circuit is constituted by an initialization controller for generating an initialization signal when data is read out at the first time from each address of said failure storing memory; and a data controller for outputting an output of the failure storing memory as it is in the case that the initialization signal does not come to said data controller from said initialization controller and outputting "0" in the case that the initialization signal comes to said data controller from said initialization controller.

3. The memory testing apparatus as set forth in claim 1, wherein said failure storing memory for storing the number of failure data read out from the failure analysis memory is a row failure storing memory provided in a row address failure counter for counting the number of failure data for each row address line of the failure analysis memory, a column failure storing memory provided in a column address failure counter for counting the number of failure data for each column address line of the failure analysis memory and a total failure storing memory provided in a total failure counter for counting the total number of failure data.

4. The memory testing apparatus as set forth in claim 3, wherein said output altering circuit is constituted by an initialization controller for applying an initialization signal to said row address failure counter when a row counter address signal for accessing said row failure storing memory is "0", applying an initialization signal to said column address failure counter when a column counter address signal for accessing said column failure storing memory is "0" and applying an initialization signal to said total failure counter when both of the row counter address signal and the column counter address signal are "0"; and data controllers provided respectively in the failure counters, each data controller outputting an output read out from the associated failure storing memory as it is in the case that the initialization signal is not applied thereto from said initialization controller and outputting "0" in the case that the initialization signal is applied thereto from said initialization controller.

5. The memory testing apparatus as set forth in claim 4, wherein said failure relief analyzer further comprises:

a TFC address formatter for formatting a total failure counter address signal for accessing the total failure storing memory of the total failure counter on the basis of row address data and column address data inputted thereto, and outputting the formatted address signal;

an RFC address formatter for formatting a row failure counter address signal for accessing the row failure storing memory of the row address failure counter on the basis of row address data and said total failure counter address signal inputted thereto, and outputting the formatted address signal;

a CFC address formatter for formatting a column failure counter address signal for accessing the column failure storing memory of the column address failure counter on the basis of column address data and said total failure counter address signal inputted thereto, and outputting the formatted address signal, and wherein said initialization controller produces said initialization signal on the basis of the row failure counter address signal supplied from said RFC address formatter and the column failure counter address signal supplied from said CFC address formatter; and said row address failure counter, said column address failure counter and said total failure counter include respective adders each adding an output of corresponding one of the failure analysis memories to an output of corresponding one of the data controllers and supplying the result of addition to corresponding one of the row failure storing memory, the column failure storing memory and the total failure storing memory.

* * * * *